(12) United States Patent
Tzu et al.

(10) Patent No.: US 6,403,267 B1
(45) Date of Patent: Jun. 11, 2002

(54) METHOD FOR HIGH TRANSMITTANCE ATTENUATED PHASE-SHIFTING MASK FABRICATION

(75) Inventors: San-De Tzu; Wei-Zen Chen, both of Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/489,500

(22) Filed: Jan. 21, 2000

(51) Int. Cl.[7] ............................................. G03F 9/00
(52) U.S. Cl. .......................................................... 430/5
(58) Field of Search ............................ 430/5, 322, 323, 430/324; 216/12, 58, 96, 99, 101, 97

(56) References Cited

U.S. PATENT DOCUMENTS

| | | | |
|---|---|---|---|
| 5,491,100 A | * 2/1996 | Lee et al. ................... | 437/41 |
| 5,503,951 A | 4/1996 | Flanders et al. ............ | 430/5 |
| 5,601,954 A | 2/1997 | Krivokapic et al. .......... | 430/5 |
| 5,614,335 A | 3/1997 | Hashimoto et al. .......... | 430/5 |
| 5,618,643 A | 4/1997 | Dao et al. ................... | 430/5 |
| 5,667,919 A | 9/1997 | Tu et al. ..................... | 430/5 |
| 5,786,114 A | 7/1998 | Hashimoto .................. | 430/5 |
| 5,789,116 A | 8/1998 | Kim ............................. | 430/5 |
| 5,792,578 A | 8/1998 | Tzu et al. .................... | 430/5 |
| 5,795,682 A | 8/1998 | Garza ........................ | 430/5 |
| 5,849,439 A | 12/1998 | Mitsui ........................ | 430/5 |
| 5,869,212 A | 2/1999 | Hashimoto .................. | 430/5 |
| 5,919,311 A | * 7/1999 | Shive et al. .................. | 134/1 |

* cited by examiner

Primary Examiner—S. Rosasco
(74) Attorney, Agent, or Firm—George O. Saile; Stephen B. Ackerman; Stephen G. Stanton

(57) ABSTRACT

A method of forming a high transmittance attenuated phase-shifting mask, comprising the following steps. A patterned shifter blank including a patterned shifter layer, having a first variable transmittance and a first phase angle overlying a partially exposed transparent substrate is provided. The partially exposed transparent substrate is etched for a first predetermined time to form trenches therein having a predetermined depth, increasing the first variable transmittance and the first phase angle to a second variable transmittance and a second phase angle, respectively. The shifter layer is treated with an aqueous solution of $NH_4OH:H_2O_2$ for a second predetermined time, increasing the second variable transmittance to a third and final, predetermined variable transmittance, and decreasing the second phase angle to a third phase angle. Whereby the third phase angle is substantially equal to the initial phase angle of said shifter layer.

18 Claims, 5 Drawing Sheets

METHOD FOR HIGH TRANSMITTANCE ATTENUATED PHASE-SHIFTING MASK FABRICATION

FIELD OF THE INVENTION

The present invention relates generally to the fabrication of photomasks and more specifically to fabrication of attenuated phase-shifting masks (APSMs) used in photolithography processes to form microminiaturized integrated circuits in semiconductor devices.

BACKGROUND OF THE INVENTION

As integrated circuits in semiconductor devices decrease in size, the photomasks used to fabricate such integrated circuits must permit formation of these smaller and smaller integrated circuits and devices. Attenuated phase-shifting masks (APSM) are one type of photomask that have been developed to allow fabrication of microminiaturized integrated circuits by lithography processes. APSMs have a mask pattern, formed on a transparent substrate, comprising a light, or radiation, transmittable portion through which a light is transmitted that has such an intensity as to substantially contribute to the exposure, and a light semi-transmittable portion, generally comprised of a shifter layer, through which a light is transmitted that has such an intensity as not to substantially contribute to the exposure. ASPMs are constituted so as to substantially invert to the phase of the light passed through the light semi-transmittable portion so that the light passed through the neighborhood of a boundary between the light transmittable portion and the light semi-transmittable portion can be mutually offset and the contrast of the boundary can be successfully maintained.

This destructive interference at the edges of the patterned shifter layer provide for sharper edged devices to be formed on the semiconductor structure that are vital for microminiaturized integrated circuits The shifter layer is only partially transmissive to light because if the transmitted radiation is too intense, it would expose a photoresist layer making patterning difficult.

Due to bad chemical durability, only 6% transmittance shifters are commercially available for deep ultraviolet (DUV) APSM fabrication. For 0.2 μm contact holes, for example, insufficient DOF is achieved for only a 6% transmittance APSM. Depth of focus (DOF) refers to when the foreground is in focus while the background is out of focus, or visa versa. This occurs in normal photography as well with the wavelengths used in patterning microminiaturized integrated circuits through photolithography. Even the micron an d sub-micron sized topography on a wafer is sufficient to cause depth of focus problems.

U.S. Pat. No. 5,789,116 to Kim describes halftone phase-shift masks having a high transmittance that comprise a transparent substrate, a phase shifter pattern formed on the substrate and a phase shifting groove that can be formed by etching the transparent substrate.

U.S. Pat. No. 5,792,578 to Tzu et al. describes a method of forming a double layer attenuating phase-shifting mask with a first and second resist that avoid having to withstand dry etching by the use of a pellicle that restricts the deposition of the second resist to the alignment region of the mask. Cleaning agents such as $H_2O_2+H_2SO_4$ followed by $H_2O+NH_4OH+H_2O_2$ or the like may be used to thoroughly clean the mask after the layer of first resist is removed.

U.S. Pat. No. 5,503,951 to Flanders et al. describes an attenuating phase-shift, semiconductor fabrication mask having recessed attenuating and phase-shifting regions that are not susceptible to phase defects in the printing regions of the mask. The surfaces of the fully transmissive regions of the mask are not altered and the attenuating regions of the mask are recessed relative to the fully transmissive regions.

U.S. Pat. No. 5,618,643 to Dao et al. describes a method and apparatus for fabricating an attenuated phase-shifting mask for use in patterning a radiation sensitive layer in a lithographic printer. In one embodiment a layer of embedded phase shift material overlies a transparent base material and attenuates the radiation and changes the phase of transmitted radiation by amounts other than 160–200°. Subsequent processing to the base material is performed to result in a net 180° phase difference between radiation transmitted by the phase shift layer and the transparent base material. Such processing of the base material may be accomplished by subsequent etching of the quartz base.

U.S. Pat. No. 5,614,335 to Hashimoto et al. describes a halftone phase-shift photomask and a blank thereof which enables the transmittance of a phase shift portion to be varied between 1% to 50% even after blank or photomask fabrication. This is accomplished by exposing the blank or photomask to a high temperature elevated to at least 150° C.; to an oxidizing atmosphere; or to a reducing atmosphere in a step that can be independent from the film-forming or photomask fabrication steps.

U.S. Pat. No. 5,667,919 to Tu et al. describes an APSM and a APSM blank each having a tantalum-silicon oxide blanket semi-transparent shifter layer formed over a transparent substrate. The tantalum-silicon oxide having the formula:

$$Ti_xSi_yO_{1-x-y}.$$

where: 0.10<x<0.3 and 0.03<y<0.1.

U.S. Pat. No. 5,601,954 to Krivokapic et al. describes a process of fabricating an attenuated phase-shifting mask having a first layer with a thickness to provide a 3 to 10% transmittance formed on a transparent substrate. A second layer is formed over the first layer and has a thickness to provide a desired phase shift. For a phase shift of 180° and i-line wavelength (365 nm), chromium is used as the first layer having a thickness of from 25 to 75 nm and silicon dioxide is used as the second layer having a thickness of from 400 to 450 nm. The chromium and silicon dioxide layers are etched, preferably by an isotropic wet etch, to form parabolically shaped sidewalls in the silicon dioxide layer that more efficiently focuses the light through the opening in the thin chromium layer.

U.S. Pat. No. 5,869,212 to Hashimoto describes an attenuated phase-shifting mask employing regions of increased light transmissivity adjacent the defined circuit pattern features which improves image resolution and depth of focus, with a minimization of image shortening effects. These regions may be provided by partially oxidizing a secondary region of the halftone masking layer. In an alternate embodiment sharper corner definition may be also be obtained by providing a generally rounded, light diffracting topography at edges of the defined circuit pattern features. In the case of a line feature, the substrate can be etched to form a recessed region including a generally concave light transmissive surface extending beneath an edge portion of the masking layer.

U.S. Pat. No. 5,786,114 to Hashimoto describes an attenuated phase-shift mask having boundary regions formed from the halftone layer used to form the circuit pattern regions. The boundary regions are shielded from a stabilization treatment of the halftone layer serving to stabilize the transmittance of the circuit pattern regions at an increased optimum level. The transmittance of the boundary regions remains relatively low thus avoiding the problem of exposure light leaking to adjacent chip areas in a step and repeat or scanning exposure process. This process eliminates the extra steps required to form isolation frames and alignment marks from a separate opaque layer and avoids the need for data sensitive sub-resolution patterning.

U.S. Pat. No. 5,795,682 to Garza describes an attenuated phase-shift reticle, or mask, design having a compensating transmissive region located where side lobe ringing is anticipated to be most severe. These compensating transmissive regions, unlike other transmissive regions on the reticle, do not have defined integrated circuit features. The radiation transmitted through the compensating transmissive region is approximately 180° out of phase with the radiation giving rise to side lobe ringing so as to destructively interfere with the out of phase radiation.

U.S. Pat. No. 5,849,439 to Mitsui describes a method of fabricating a half tone phase shift mask blank formed from a thin film comprising a material including oxygen, nitrogen, silicon, and a metal as main components. The thin film is formed on a transparent substrate by a reactive sputtering process using a mixed target of molybdenum and silicon.

SUMMARY OF THE INVENTION

Accordingly, it is an object of the present invention to provide a method of fabricating high transmission attenuated phase-shifting masks with commercially available shifter blanks.

Another object of the present invention is to provide a method of increasing transmittance of shifter layers by quartz substrate over-etching and chemical treatment.

A further object of the present invention is to provide a method of increasing transmittance of shifter blanks while maintaining an 180° out of phase radiation shift.

Yet another object of the present invention is to provide a variable transmittance phase-shifting mask manufacturable by a single process with a single chemical treatment flow.

Another object of the present invention is to provide a method of increasing transmittance of shifter blanks while maintaining the initial out of phase radiation shift of the shifter blanks.

Other objects will appear hereinafter.

It has now been discovered that the above and other objects of the present invention may be accomplished in the following manner. Specifically, a patterned shifter blank including a patterned shifter layer, having a first variable transmittance and a first phase angle overlying a partially exposed transparent substrate is provided. The partially exposed transparent substrate is etched for a first predetermined time to form trenches therein having a predetermined depth, increasing the first variable transmittance and the first phase angle to a second variable transmittance and a second phase angle, respectively. The shifter layer is treated with an aqueous solution of $NH_4OH:H_2O_2$ for a second predetermined time, increasing the second variable transmittance to a third and final, predetermined variable transmittance, and decreasing the second phase angle to a third phase angle. Whereby the third phase angle is substantially equal to the initial phase angle of said shifter layer.

BRIEF DESCRIPTION OF THE DRAWINGS

The features and advantages of the method of forming a high transmittance attenuated phase-shifting mask according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

The following is a summary of the process steps of the invention to a shifter blank having an initial predetermined transmittance and phase angle:

1. E-beam exposure of the overlying shifter blank photoresist layer.

2. Develop the photoresist layer.

3. Cr wet etching, or dry etching, of the Cr mask layer.

4. Shifter layer dry etching and transparent substrate (Qz) dry etching for a first predetermined time to form a trench (es) having a predetermined depth to achieve a second increased transmittance and a second increased phase angle.

5. Strip the photoresist layer.

6. $NH_4OH:H_2O_2$ treatment for a second predetermined time to increase the second transmittance to a third, target transmittance, and decrease the second phase angle that is substantially equal to the initial phase angle.

Figure 1:
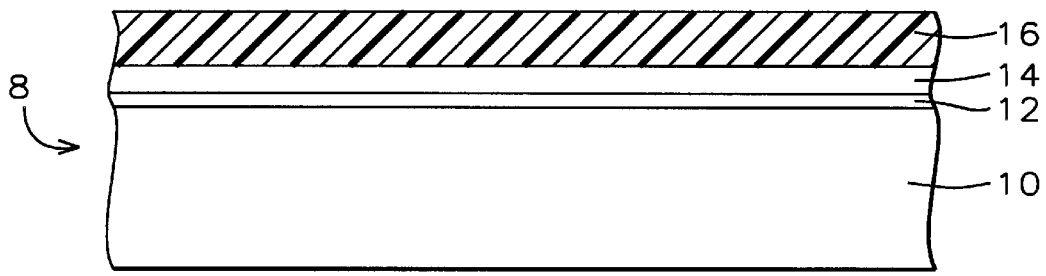
FIGS. 1 to 8 show a series of schematic cross-sectional diagrams illustrating the results of progressive stages in forming a high transmittance attenuated phase-shifting mask in accordance with a preferred embodiment of the method of the present invention.

FIG. 1 shows a commercially available shifter blank 8, for deep ultraviolet (DUV) attenuated phase-shifting mask (APSM) making, having photoresist layer 16 formed thereover. Shifter blank 8 comprises: masking layer 14 over shifter layer 12 formed over transparent substrate 10 and may be fabricated, or is commercially available from Ulcoat, or sold under the trademark MSK5™ manufactured by HiYa.

Transparent layer 10 is preferably comprised of quartz from about 0.6 to 0.7 cm thick and is more preferably about 0.65 cm thick.

Shifter layer 12 may be formed over transparent substrate 10 by sputtering and provides from about 3 to 8% transmittance, and more preferably about 6%. Shifter layer 12 may be comprised of MoSiO (molybdenum silicon oxide) or CrON (chromium oxynitride) and is preferably comprised of MoSiON (molybdenum silicon oxynitride). For purposes of illustration, shifter layer 12 will be considered to be composed of MoSiON. Shifter layer 12 is from about 700 to 1500 Å thick, and is more preferably about 900 Å thick.

Masking layer 14 may be comprised of CrO (chromium oxide) and is more preferably comprised of Cr (chromium). For purposes of illustration, masking layer 14 will be considered to be composed of Cr. Masking layer 14 may be about 1000 Å thick.

Photoresist layer 16 may be about 0.5 μm thick.

Figure 10:
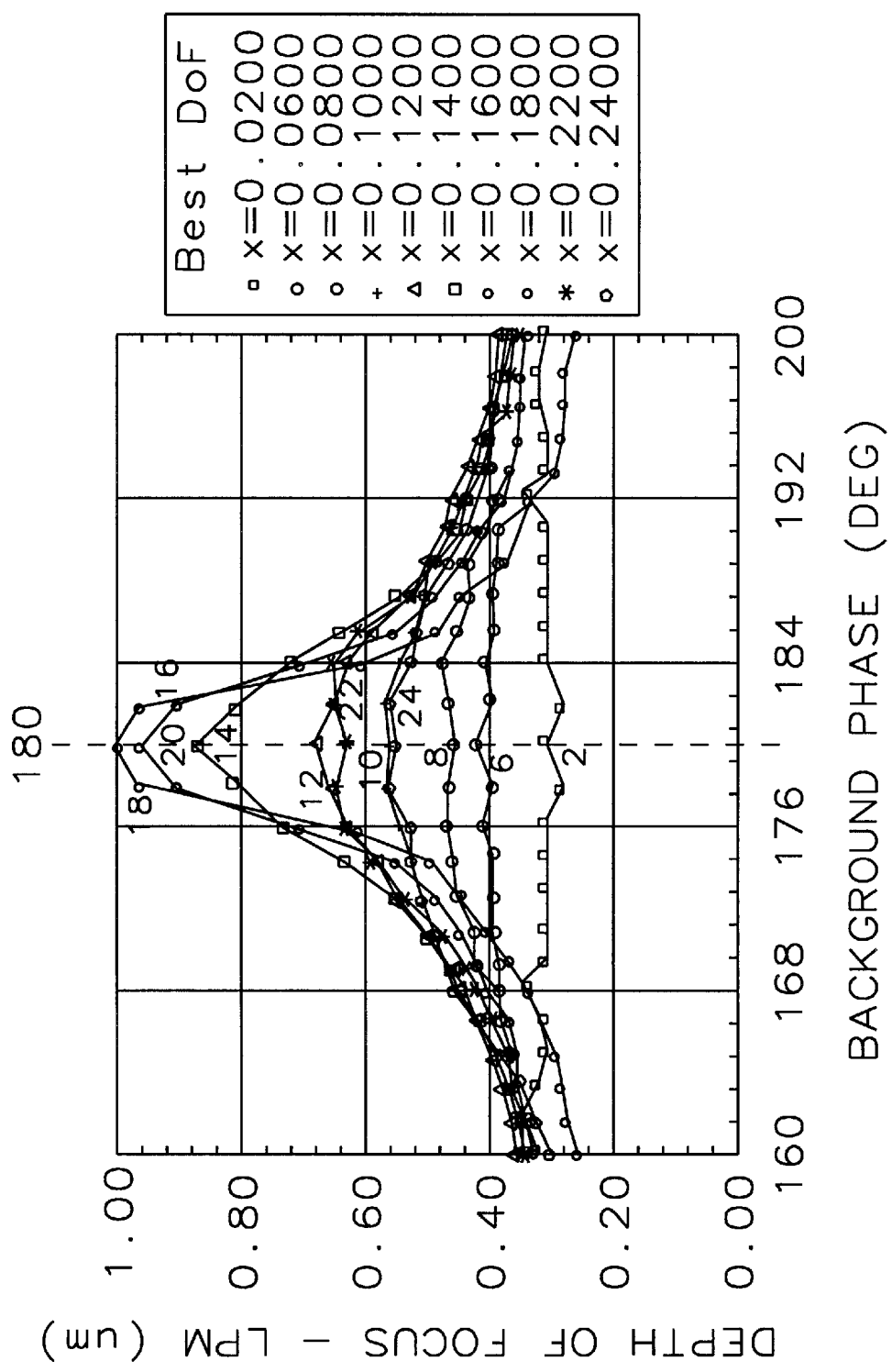
FIG. 10 is a graph plotting depth of focus (DOF) versus background phase, or phase shift for various percent transmittances for 200 nm contact holes with a 480 nm pitch.

Shifter blank 8 has a transmittance $T_{initial}$ from about 3 to 8%, and more preferably about 6% (a first transmittance) and may have a phase angle $P_{Initial}$ of 180° (a first phase angle). For the purposes of illustration, shifter blank 8 has a transmittance of 6% and a phase angle of 180°. The phase angle refers to the shift in radiation from the nominal value of radiation transmitted through a mask area not covered by shifter layer 12. FIG. 10 shows the depth of focus (DOF), for 200 nm contact holes with a 480 nm pitch, plotted with respect to phase angle and percent transmittance. Simulation suggests that increasing the percent transmittance, increases the DOF. This is achieved by chemical treatment with SC1 for a first predetermined time (as described below), and over-etching of the quartz substrate for a second predetermined time to maintain the desired 180° phase shift.

Figure 2:
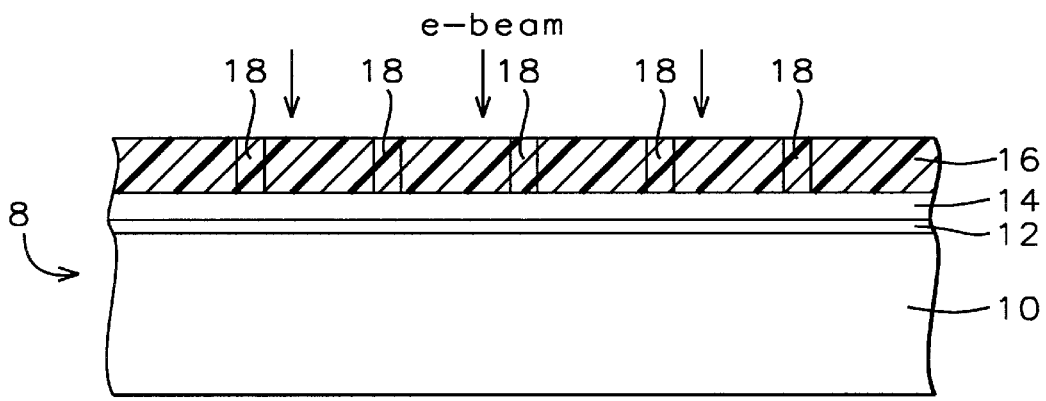

As shown in FIG. 2, photoresist layer 16 is subjected to an e-beam exposure, at areas 18. Any desired pattern may be formed depending upon the desired final attenuated phase shift mask.

Figure 3:
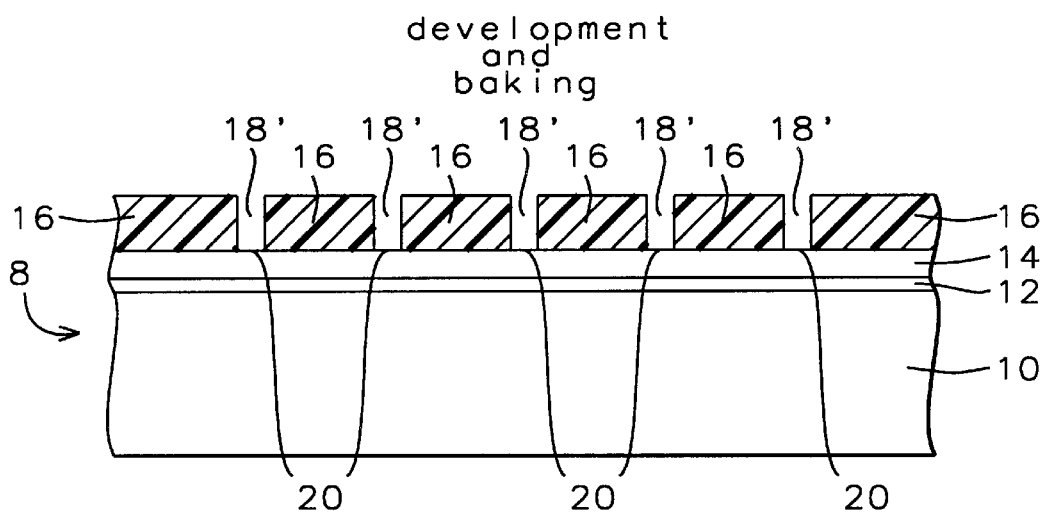

As shown in FIG. 3, photoresist (PR) layer 16 is developed and baked to form openings 18' within patterned PR layer 16, exposing portions 20 of underlying Cr masking layer 14.

Figure 4:
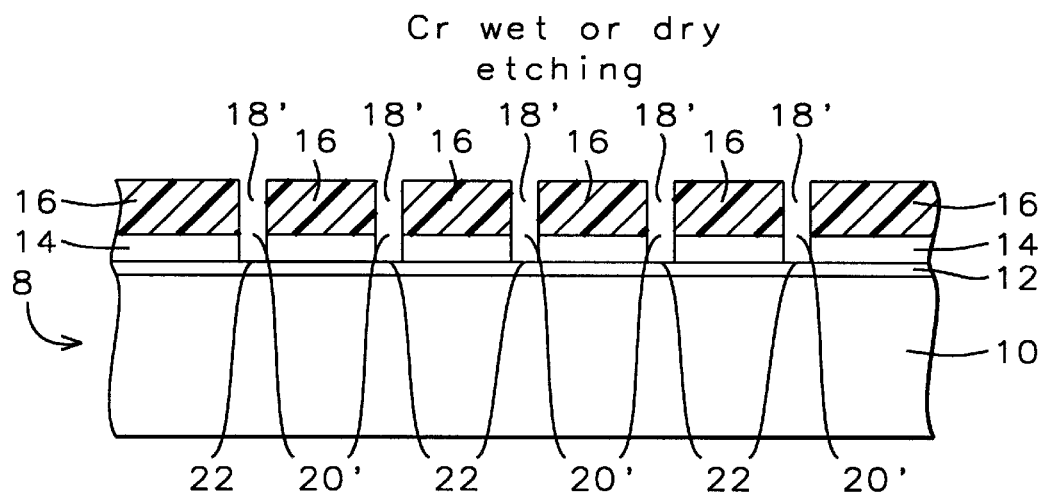

As shown in FIG. 4, a Cr wet etch, or a Cr dry etch, is performed to etch Cr masking layer 14 at exposed portions 20 to form openings 20' within patterned Cr masking layer 14. Cr masking layer 14 openings 20' expose portions 22 of underlying MoSiON shifter layer 12.

In the key portion of the invention, comprising two steps, commercial (for example) phase blank 8 is treated to achieve an increased transmittance without a change in the 180° (for example) phase shift $P_{Initial}$. The following two steps may be done sequentially, as illustrated for purposes of example, or may be accomplished at the same time.

First Step

Figure 5:
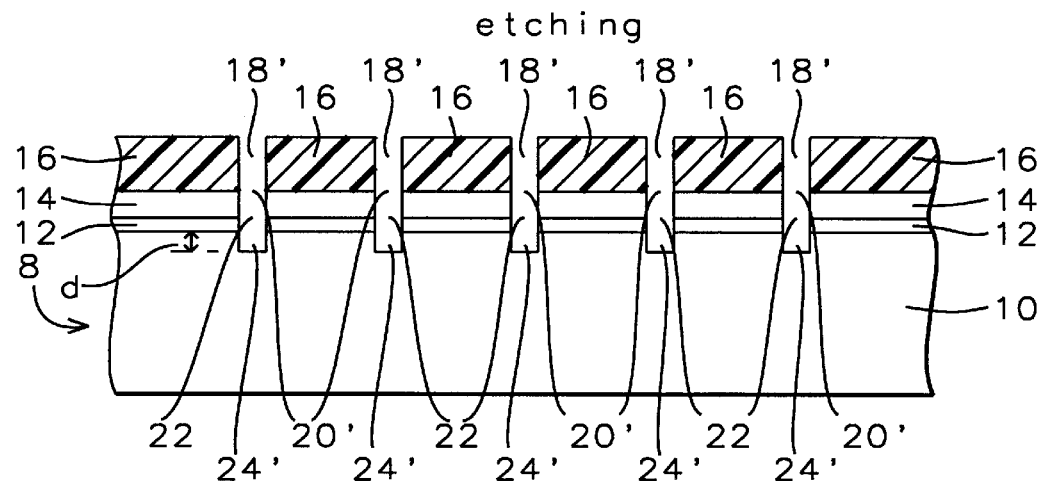

As shown in FIG. 5, MoSiON shifter layer 12 is dry etched at exposed portions 22 to form openings 22' within patterned MoSiON shifter layer 12. Shifter layer 12 openings 22' expose underlying portions of quartz substrate 10.

Quartz substrate 10 is over-etched by a dry etch for a first predetermined time $t_1$ to form trenches 24' each having a predetermined depth "d". The dry etch may use $SF_6/He$ or $CHF_3/O_2$ and is conducted at the following parameters, for example: $SF_6$ at a flow of from about 20 to 30 sccm; He at a flow of from about 3 to 10 sccm; using ICP (inductor coupled plasma) at a power from about 200 to 400 W; RIE (reactive ion etch) at a power from about 10 to 100 W; a pressure from about 5 to 10 mTorr; and at a temperature at about 25° C. (room temperature) for a first predetermined time $t_1$.

It is possible to etch shifter layer 12 and quartz substrate 10 in the same in situ etch step, although they are preferably sequentially etched as described above.

Etching of trenches 24' having a depth d within quartz substrate 10 causes an increase in the phase angle ($P_{Initial}$) of shifter blank 8 of FIG. 1 to a second, increased phase angle ($P_{Second}$). The rate of phase angle change ($R_{EtCh}$) for the quartz substrate dry etch multiplied by the time ($t_1$) of the dry etch, achieves the amount of change in phase angle ($P_{Second}$), i.e.

$$(R_{Etch})(t_1)=P_{Second}.$$

$P_{Second}$ is selected to compensate for the phase angle change incurred during the Second Step (FIG. 7) SC1 treatment (discussed below).

Figure 6:
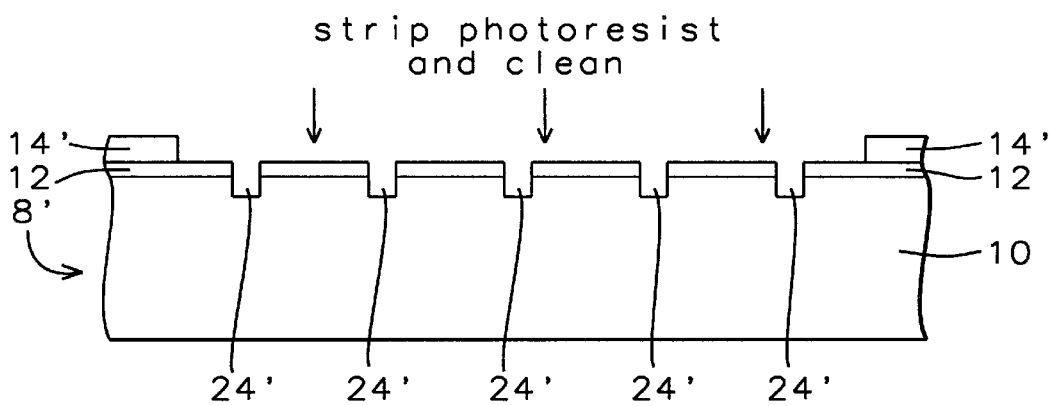

As shown in FIG. 6, patterned PR layer 16 is stripped and removed. Selected portions of Cr mask layer 14 are removed leaving portions 14' for example. The structure is then cleaned to form APSM (attenuated phase-shifting mask) 8' having a second transmittance substantially equal to the first transmittance (6%) and a phase angle of $180°+P_{Second}$ (the initial phase angle plus the increase in phase angle due to over-etching of quartz substrate).

It is understood that the structure shown in FIG. 6 (and thereafter FIGS. 7 and 8) is only an example and any high transmittance APSM may be fabricated including, for example, binary masks and rim type masks.

Second Step

Figure 7:
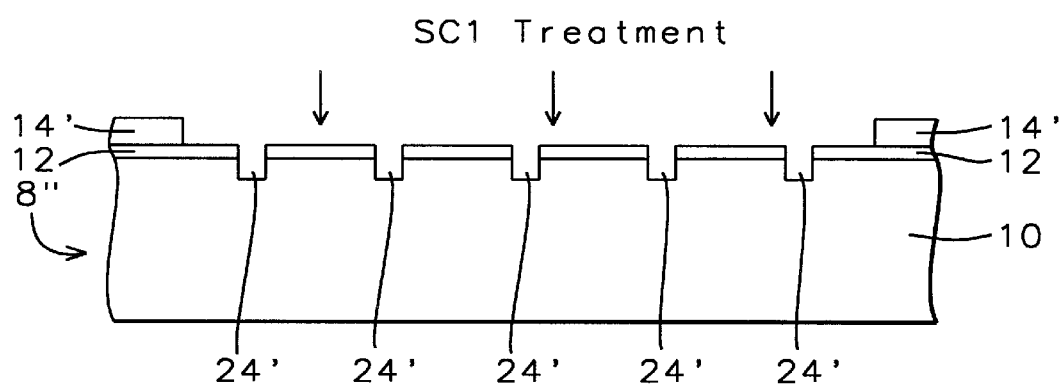

As shown in FIG. 7, APSM 8' is chemically treated by SC1, i.e. an aqueous solution of preferably $NH_4OH:H_2O_2$ in the ratio one part $NH_4OH$, one part $H_2O_2$ and five parts $H_2O$ (for purposes of illustration, this composition of SC1 will be deemed used)at from about 30 to 80C, more preferably from about 35 to 45° C., and most preferably about 40° C. under the following additional parameters: 400 W Mega-Sonic for a second predetermined time $t_2$ to form APSM 8" having a final transmittance $T_{Final}$ (preferably greater than $T_{Initial}$) and a final phase angle $P_{Final}$ (that is equal to the $P_{Initial}$)

SC1 is a liquid base also used as a cleaning solution for masks.

Figure 9A:
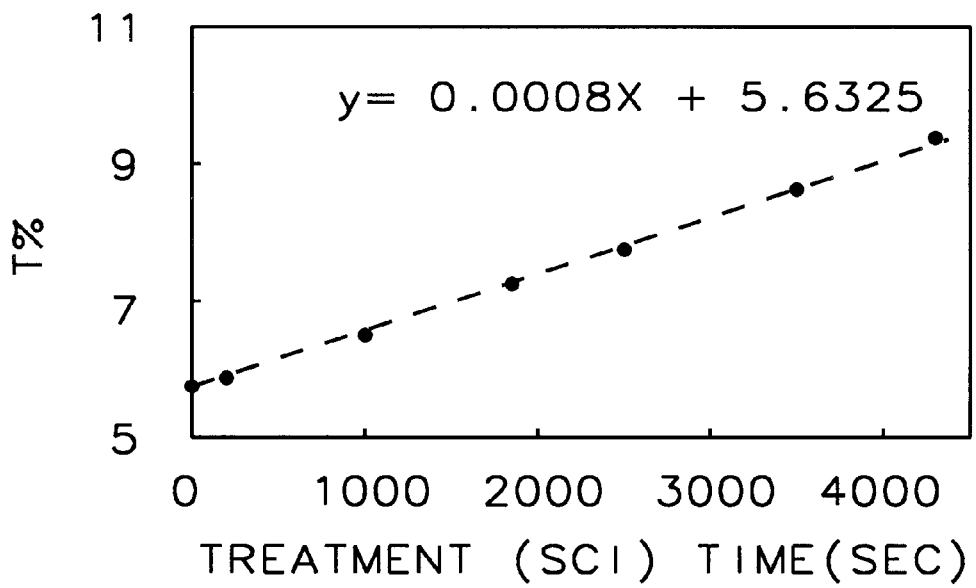
FIG. 9a is graph plotting SC1 treatment time of the shifter layer against the change in transmittance of the shifter layer.
Figure 9B:
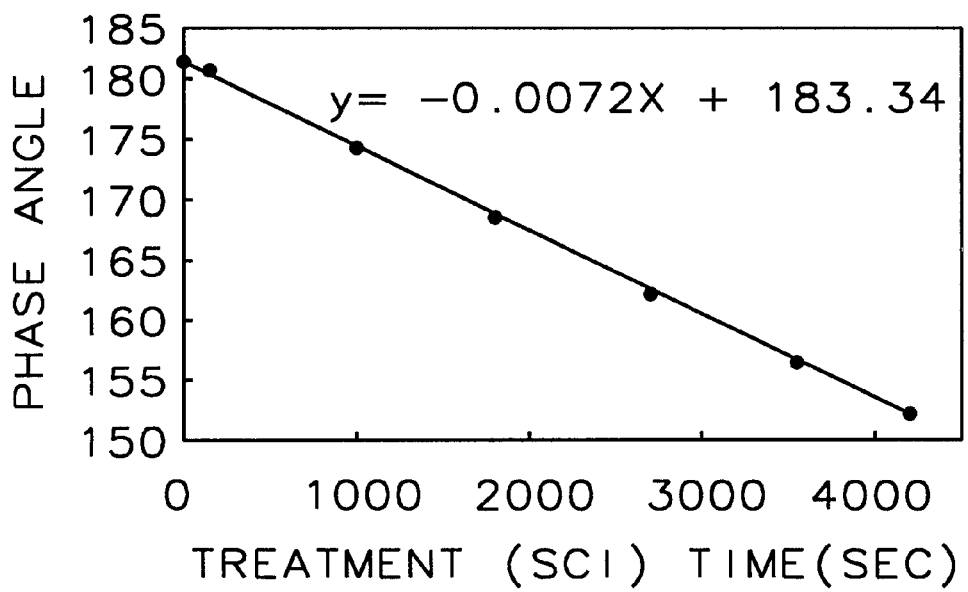
FIG. 9b is a graph plotting SC1 treatment time of the shifter layer against the change in phase angle of the shifter layer.

It is possible to use an SC1 solution having different ratios of $NH_4OH$, $H_2O_2$ and $H_2O$ which would change the reaction rate and thus the data shown in FIGS. 9a and 9b.

As shown in FIG. 9a, the SC1 chemical treatment of the present invention increases the second transmittance (which is essentially the first transmittance) of APSM 8' at a transmittance change rate of 0.048% transmittance/minute. As shown in FIG. 9b, the SC1 chemical treatment also decreases the phase angle of APSM 8' at a phase angle change $R_{SC1}$ rate of 0.432°/minute.

It is not completely understood how the SC1 treatment of APSM 8' affects its transmittance and phase angle. However, it is believed that SC1 may etch shifter layer 12 or maybe quartz substrate 10 by an oxidation reaction (although any SC1 quartz substrate 10 etching is negligible and does not substantially affect the phase angle or transmittance of APSM 8'). It is also possible that the SC1 treatment thins, and may also cause shifter layer 12 to change composition.

Figure 8:
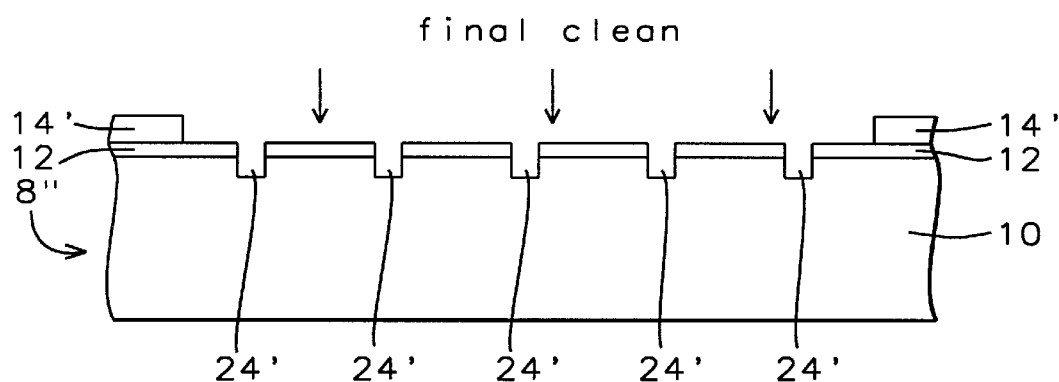

As shown in FIG. 8, APSM 8" is then subjected to a final cleaning step.

In any event to increase transmittance from 6% to a target transmittance of 18% (assuming the second transmittance is substantially equal to the first 6% transmittance), a 12% increase, , for example, a 250 minute ($t_2$) Step Two SC1 treatment is required (12%/0.048% transmittance/minute= 250 minutes) which would decrease the phase angle 108° (250 minutes×0.432°/minute=108°) to an unacceptable 72° (180°−108°=72°). To compensate for this lost phase angle and return to the desired 180° phase shift, the quartz substrate is first over-etched for a predetermined time $t_1$ in Step One which increases the phase angle to compensate for the subsequent Step Two SC1 treatment.

Thus, by controlling the Step One quartz over-etching time $t_1$, and thus the depth d of trenches 24', the loss in phase angle due to the subsequent Step Two SC1 chemical treatment necessary to achieve the desired final transmittance ($T_{Final}$) may be recovered so the initial phase angle of blank 8, usually 180°, is re-captured. That is:

a) to obtain an APSM 8" having a final transmittance $T_{Final}$ and a final phase angle $P_{Final}$ equal to the initial phase angle $P_{Initial}$ of a starting blank 8 having an initial transmittance $T_{Initial}$ undergoing:

c) a Step One quartz substrate 10 over-etching having a phase angle change rate of $R_{EtCh}$ for a time $t_1$; and d) a Step Two SC1 treatment having a phase angle change rate of $R_{SC1}$ and a transmittance change rate delta $T_{EtCh}$ for a time $t_2$; then solution of the following two simultaneous equations allows calculation of the times $t_1$ and $t_2$:

$$(t_1)(R_{Etch}) - (t_2)(R_{SC1}) = 0; \text{ and} \quad 1)$$

$$(t_2)(\text{delta } T_{Etch}) = T_{Final}. \quad 2)$$

The present invention thus permits controlled increase of the transmittance of commercially available blanks during mask fabrication from the blanks while maintaining the initial phase angle, usually 180°, of the commercial blanks. The final masks so fabricated may then be used as reticules for wafer exposure. Prior art methods do not compensate for changes in the phase angle of the blanks during increase of the blank's transmittance.

While the present invention provides a method to increase the initial transmittance of a commercially available blank while maintaining the blank's initial phase angle, it is obvious that it is also possible to increase the initial transmittance of a commercially available blank and to either increase or decrease the blank's initial phase angle to any desired final phase angle.

While particular embodiments of the present invention have been illustrated and described, it is not intended to limit the invention, except as defined by the following claims.

We claim:

1. A method of forming a high transmittance attenuated phase-shifting mask, comprising the steps of:
   providing a patterned shifter blank including a patterned shifter layer, having a first variable transmittance and a first phase angle overlying a partially exposed transparent substrate;
   etching said partially exposed transparent substrate for a first predetermined time to form trenches therein having a predetermined depth, increasing said first variable transmittance and said first phase angle to a second variable transmittance and a second phase angle, respectively; and
   treating said shifter layer with an aqueous solution of $NH_4OH:H_2O_2$ for a second predetermined time, increasing said second variable transmittance to a third and final, predetermined variable transmittance, and decreasing said second phase angle to a third phase angle, whereby said third phase angle is substantially equal to said initial phase angle of said shifter layer.

2. The method of claim 1, wherein said transparent substrate is quartz and said shifter layer is MoSiON.

3. The method of claim 1, wherein said aqueous solution of $NH_4OH:H_2O_2$ consists essentially of one part $NH_4OH$, one part $H_2O_2$, and five parts $H_2O$ and said treatment of said shifter layer with said aqueous solution of $NH_4OH:H_2O_2$ is conducted from about 30 to 80° C.

4. The method of claim 1, wherein said aqueous solution of $NH_4OH:H_2O_2$ consists essentially of one part $NH_4OH$, one part $H_2O_2$, and five parts $H_2O$ and said treatment of said shifter layer with said aqueous solution of $NH_4OH:H_2O_2$ is conducted from about 35 to 45° C.

5. The method of claim 1, wherein said shifter layer is from about 700 to 1500 Å thick.

6. The method of claim 1, wherein said shifter layer is about 900 Å thick.

7. The method of claim 1, wherein said initial phase angle of said shifter layer is about 180°.

8. The method of claim 1, wherein said first variable transmittance of said shifter layer is from about 3 to 8% and said third and final variable transmittance is from about 4 to 25%.

9. The method of claim 1, wherein said etching of said trench in said transparent substrate is dry etching at the following parameters: $SF_6$=from about 20 to 30 sccm; He=from about 3 to 10 sccm; ICP=from about 200 to 400 W; RIE=from about 10 to 100 W; and pressure=from about 5 to 10 mTorr.

10. A method of forming a high transmittance attenuated phase-shifting mask, comprising the steps of:
    providing a patterned shifter blank including a patterned shifter layer, having a first variable transmittance and a first phase angle of 180° overlying a partially exposed transparent substrate;
    etching said partially exposed transparent substrate for a first predetermined time to form trenches therein having a predetermined depth, increasing said first variable transmittance and said first phase angle to a second variable transmittance and a second phase angle, respectively; and
    treating said shifter layer with an aqueous solution of $NH_4OH:H_2O_2$ for a second predetermined time, increasing said second variable transmittance to a third and final, predetermined variable transmittance, and decreasing said second phase angle to a third phase angle, whereby said third phase angle is substantially equal to said initial phase angle of said shifter layer; said aqueous solution of $NH_4OH:H_2O_2$ consisting essentially of one part $NH_4OH$, one part $H_2O_2$, and five parts $H_2O$ and said treatment of said shifter layer with said aqueous solution of $NH_4OH:H_2O_2$ is conducted from about 30 to 80° C.

11. The method of claim 10, wherein said shifter layer is from about 700 to 1500 Å thick.

12. The method of claim 10, wherein said shifter layer is about 900 Å thick.

13. The method of claim 10, wherein said first variable transmittance of said shifter layer is from about 3 to 8% and said final variable transmittance is from about 4 to 25%.

14. A method of forming a high transmittance attenuated phase-shifting mask, comprising the steps of:
    providing a patterned shifter blank including a patterned shifter layer, having a first variable transmittance and a first phase angle of 180° overlying a partially exposed transparent substrate; said shifter layer having a thickness of from about 700 to 1500 Å thick;
    etching said partially exposed transparent substrate for a first predetermined time to form trenches therein having a predetermined depth, increasing said first variable transmittance and said first phase angle to a second variable transmittance and a second phase angle, respectively; and
    treating said shifter layer with an aqueous solution of $NH_4OH:H_2O_2$ for a second predetermined time, increasing said second variable transmittance to a third and final, predetermined variable transmittance, and decreasing said second phase angle to a third phase angle, whereby said third phase angle is substantially equal to said initial phase angle of said shifter layer; said aqueous solution of $NH_4OH:H_2O_2$ consisting essentially of one part $NH_4OH$, one part $H_2O_2$, and five parts $H_2O$ and said treatment of said shifter layer with said aqueous solution of $NH_4OH:H_2O_2$ is conducted from about 35 to 45° C.

15. The method of claim 14, wherein said transparent substrate is quartz and said shifter layer is MoSiON.

16. The method of claim 14, wherein said shifter layer has a thickness of about 900 Å.

17. The method of claim 14, wherein said treatment of said shifter layer with said aqueous solution of $NH_4OH:H_2O_2$ is conducted at about 40° C.

18. The method of claim 14, wherein said first variable transmittance of said shifter layer is from about 3 to 8% and said final variable transmittance is from about 4 to 25%.

* * * * *